United States Patent [19]

Smeulers

[11] Patent Number: 4,651,025
[45] Date of Patent: Mar. 17, 1987

[54] CIRCUIT FOR GENERATING A TRIANGULAR VOLTAGE

[75] Inventor: Wouter Smeulers, Eindhoven, Netherlands

[73] Assignee: U.S. Philips Corporation, New York, N.Y.

[21] Appl. No.: 605,959

[22] Filed: May 2, 1984

[30] Foreign Application Priority Data

May 13, 1983 [NL] Netherlands .......................... 8301714

[51] Int. Cl.⁴ .......................... H03K 4/86; H03K 17/56
[52] U.S. Cl. ................................... 307/228; 307/246; 307/247.1; 307/296 R; 328/181
[58] Field of Search ........................ 328/181, 185, 183; 307/271, 228, 273, 246, 247, 296 R; 331/111

[56] References Cited

U.S. PATENT DOCUMENTS

| | | | |
|---|---|---|---|
| 3,553,198 | 7/1971 | Karcher | 331/111 |
| 3,835,402 | 5/1974 | Kublick | 328/181 |
| 3,862,436 | 1/1975 | George | 328/183 |
| 3,893,036 | 7/1975 | Cavoretto et al. | 328/181 |
| 4,393,314 | 7/1983 | Kunze | 328/181 |

Primary Examiner—Stanley D. Miller
Assistant Examiner—B. P. Davis
Attorney, Agent, or Firm—Thomas A. Briody; William J. Streeter; Edward W. Goodman

[57] ABSTRACT

A circuit for generating a triangular voltage ($V_c$) across a capacitor (C) having a charging current source (1, 2) and a discharging current source (3, 4) for the capacitor (C). A comparison stage (11, 12, 13, 14) compares the generated voltage ($V_c$) with a first and a second reference voltage, respectively, from a voltage divider (17, 18, 19) and controls the generation of a setting and a resetting signal, respectively, at a bistable switching element (20, 21) when the value of the first and the second reference voltage, respectively, is reached. The bistable element (20, 21) controls a switch (7, 8) which determines charging or discharging, respectively, of the capacitor (C). The circuit is suitable for high repetition rates because of the fact that a buffer stage (28) is connected to the capacitor (C) for deriving, under the control of the capacitor voltage ($V_c$), a supply voltage for the bistable switching element (20, 21) which is of the same order of magnitude and varies in the same direction as the generated triangular voltage. Preferably, the switch (1, 8) and the bistable switching element (20, 21) do not employ pnp-transistors.

8 Claims, 1 Drawing Figure

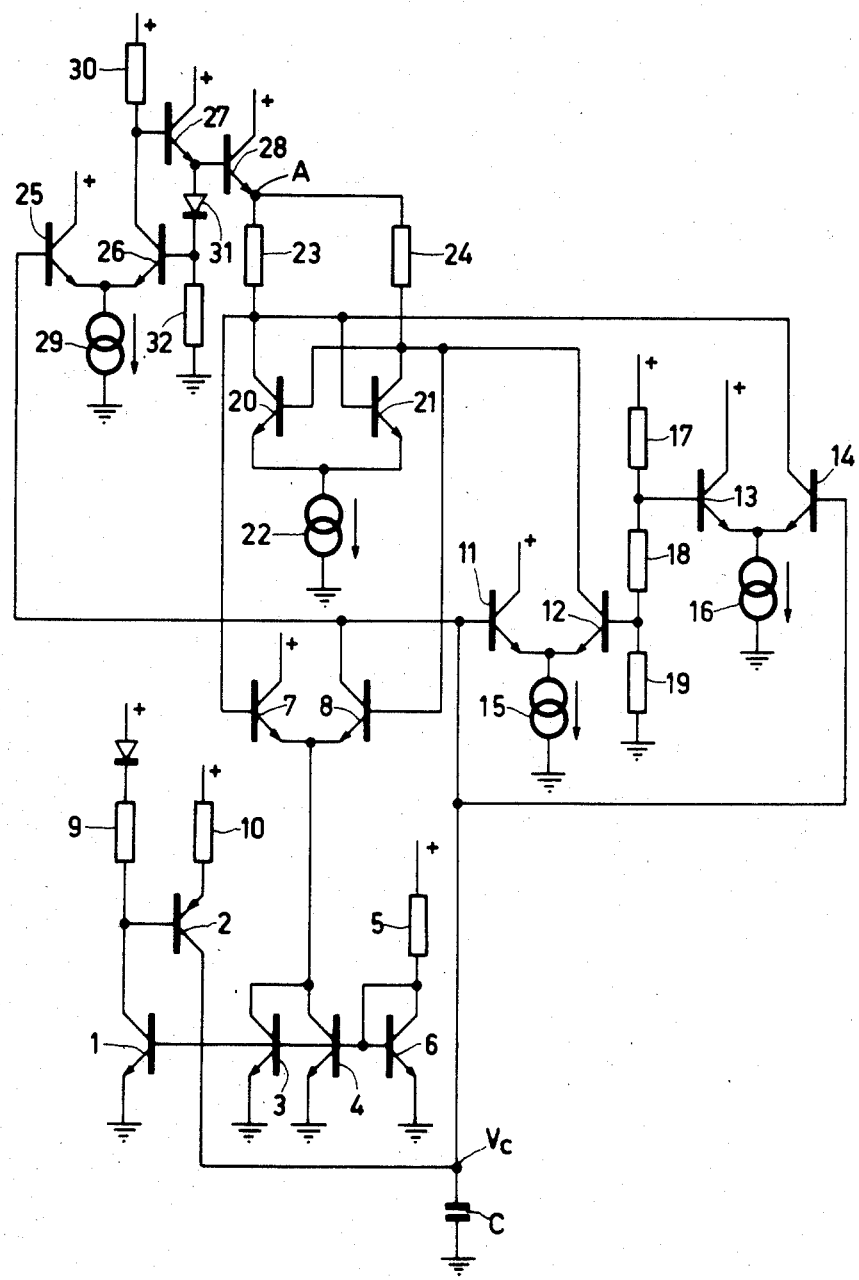

CIRCUIT FOR GENERATING A TRIANGULAR VOLTAGE

BACKGROUND OF THE INVENTION

The invention relates to a circuit for generating a triangular voltage across a capacitor, comprising a charging current source for charging the capacitor, a discharging current source for thereafter discharging the capacitor, a comparison stage for comparing the generated voltage with a first and a second reference voltage, respectively, and for respectively generating a setting signal when the value of the first reference voltage is reached, and a resetting signal when the value of the second reference voltage is reached, and a bistable switching element which, in response to the setting or resetting signal, respectively, repeatedly changes its state to control a switch which determines charging or discharging, respectively, of the capacitor.

Such a circuit is disclosed in U.S. Pat. No. 3,745,367. In that prior circuit the bistable element ensures that the capacitor is discharged without fail after the generated triangular voltage has reached the value of one reference voltage, and is charged without fail after the voltage has reached the other reference voltage. The bistable element is formed of transistors with associated resistors, these transistors being operative as controlled switches which are supplied with the supply voltage of the circuit. This implies that these transistors handle comparatively high voltages, that is to say, expressed more accurately, that the voltages at the various electrodes thereof are submitted to a great variation at the transition from one stable state to the other stable state of the element. The same holds for the switch which determines whether the capacitor is charged or discharged, as the case may be.

SUMMARY OF THE INVENTION

The invention has for its object to provide an improved circuit of the above-described type which is capable of generating a triangular voltage with a high repetition rate, and to that end the circuit according to the invention is characterized in that the circuit also comprises a buffer stage connected to the capacitor for deriving, under control of the capacitor voltage a supply voltage, for the bistable switching element which is of the same order of magnitude and varies in the same direction as the generated triangular voltage.

The invention is based on the recognition that, because of the above-mentioned, large voltage swing across the different switching transistors, the known circuit is not suitable for high frequencies. Thanks to the measure according to the invention, the variation of the voltage across the transistors of the bistable element and of the switch is low, so that this variation can be rapidly passed through, as a result of which the switch is rapidly rendered non-conductive or conductive, respectively.

Preferably, the circuit is characterized in that the variation of the supply voltage for the bistable switching element is substantially equal to the variation of the generated triangular voltage.

The circuit may be characterized in that the supply voltage for the bistable switching element is substantially equal to the voltage across the capacitor.

The circuit may also be characterized in that the buffer stage comprises a transistor operating as an emitter-follower and whose emitter is connected to the supply voltage terminal of the bistable switching element and whose base carries a voltage the difference between which and the voltage across the capacitor is approximately equal to one or more times a diode threshold voltage.

Still better high-frequency properties will be obtained if the circuit is further characterized in that the switch only comprises semiconductor switching elements whose operation is predominantly based on electron conduction and which are operative out of the saturation range, and that the bistable switching element comprises only semiconductor switching elements whose operation is predominantly based on electron conduction and which are operative out of the saturation range.

DESCRIPTION OF THE DRAWING

The invention will be described in greater detail by way of example with reference to the accompanying drawing whose sole FIGURE shows an embodiment of the circuit according to the invention.

DESCRIPTION OF THE PREFERRED EMBODIMENT

For the benefit of a capacitor C, the circuit of the FIGURE comprises a charging current source including two transistors 1 and 2, a discharging current source including two transistors 3 and 4 and a switch including two transistors 7 and 8. Transistor 2 is of the pnp-type whereas all the other transistors of the circuit are of the npn-type. A resistor 5 is arranged in series with a transistor 6 which is connected as a diode and whose base is connected to the base of transistor 1 and to the bases of transistors 3 and 4. The emitters of transistors 1,3,4 and 6 are connected to ground. The collector of transistor 1 is connected to a positive 12 V supply voltage via a resistor 9 and a compensating diode. The emitter of transistor 2 is connected to the supply voltage via a resistor 10 of substantially the same value as resistor 9, while the base is connected to the collector of transistor 1 and the collector to capacitor C. The other terminal of capacitor C is connected to ground. The collectors of transistors 3 and 4 are interconnected and connected to the emitters of transistors 7 and 8. The collector of transistor 7 is connected to the supply voltage whereas the collector of transistor 8 is connected to capacitor C.

If the current flowing through resistor 5 is denoted by i, then it appears from the foregoing that the collector current of transistor 2 is substantially equal to current i. This collector current charges capacitor C. Current source 1, 2 may of course be replaced by a resistor. Through the conductor between transistors 3 and 4 on the one hand and transistors 7 and 8 on the other hand, a current flows which is substantially equal to 2i and which is distributed over transistors 7 and 8 in response to drive signals, still further to be described, of these transistors. If transistor 8 conducts while transistor 7 is non-conductive, then a current approximately equal to 2i flows from capacitor C to the collector of transistor 8, so that capacitor C is discharged by a current i. In these circumstances, a symmetrical triangular voltage is present across the capacitor. It will be obvious that a different choice for the current sources will result in a non-symmetrical voltage shape. If one current is many times larger than the other current, then the generated voltage is a sawtooth voltage.

A comparison stage comprising four transistors 11, 12, 13 and 14 is connected to capacitor C. The emitters of transistors 11 and 12 are interconnected and connected to a current source 15. Similarly, the emitters of transistors 13 and 14 are interconnected and connected to a current source 16. The base of transistor 11 and the base of transistor 14 are connected to capacitor C. The series arrangement of three resistors 17, 18 and 19 is arranged between the supply voltage and ground. The base of transistor 12 is connected to the junction between the resistors 18 and 19, at which junction a reference voltage of 3 V is present. Similarly, the base of transistor 13 is connected to the junction between resistors 17 and 18, at which junction a reference voltage of 6 V is present. The collectors of transistors 11 and 13 are connected to the supply voltage.

In addition, the circuit comprises a bistable switching element in the form of a flip-flop having two transistors 20 and 21. The emitters thereof are interconnected and connected to a current source 22. The base of transistor 20 is connected to the collector of transistor 21, to the collector of transistor 12 and also to the base of transistor 8. Similarly, the base of transistor 21 is connected to the collector of transistor 20, to the collector of transistor 14 and also to the base of transistor 7. Between a point A, at which a positive supply voltage is present, and the collector of transistor 20, a resistor 23 is connected, while between point A and the collector of transistor 21, a resistor 24 is connected.

The above-described circuit is well known to a person skilled in the art. During a portion of the period, transistor 8 is non-conductive, so that capacitor C is charged by the collector current of transistor 2. The voltage $V_c$ across the capacitor is more than 3 V but less than 6 V and increases substantially linearly. Transistors 11 and 12 form a level detector: transistor 11 conducts and transistor 12 is non-conductive. Also the transistors 13 and 14 form a level detector, transistor 13 being conductive while transistor 14 is non-conductive. Flip-flop 20, 21 is in the state in which transistor 20 is non-conductive while transistor 21 conducts. The voltage at the collector of transistor 20 is high while the voltage at the collector of transistor 21 is low, as a result of which transistor 7 is kept in the conductive state and transistor 8 in the non-conductive state.

When voltage $V_c$ reaches the value 6 V, the transistor 14 is rendered briefly conductive, causing the voltage at the collector of transistor 20 to become lower. Flip-flop 20, 21 switches to the state in which transistor 20 conducts while transistor 21 is non-conductive. This causes transistor 8 to become conductive while transistor 7 is rendered non-conductive. Since the current from source 3,4 exceeds the collector current of transistor 2, voltage $V_c$ decreases substantially linearly. Because of the presence of the flip-flop 20, 21, this situation is maintained until voltage $V_c$ has reached the value 3 V, causing transistor 12 to become briefly conductive which resets the flip-flop 20, 21 to the above-described state in which transistor 20 is non-conductive while transistor 21 conducts, the voltage $V_c$ generated across capacitor C then increasing again.

With the arrangement described, point A is not connected directly to the supply voltage of the circuit but to the emitter of a transistor 28 which operates as an emitter-follower and whose collector is connected to the supply voltage. The emitters of two transistors 25 and 26 are interconnected and connected to a current source 29. The collector of transistor 26 is connected to the base of a transistor 27 and to a resistor 30, whose other end is connected to the supply voltage. The base of transistor 25 is connected to capacitor C. The anode of a diode 31 is connected to the emitter of transistor 27 and to the base of transistor 28, while the cathode is connected to the base of transistor 26 and to a resistor 32 whose other terminal is connected to ground.

The emitter current of transistor 25 and the emitter current of transistor 26 are both approximately equal to half the current from source 29. If there is inequality between these currents, then the negative feedback path comprising transistor 27 and diode 31 ensures a change in the voltage at the base of transistor 26, causing the difference to become smaller. In this situation, it is assumed that the current gain of the transistors is very high. In these circumstances, the voltage at point A is substantially equal to voltage $V_c$. In the time interval in which voltage $V_c$ decreases and transistor 8 is conductive, the voltage at the base of this transistor 8, which is connected to the collector of the non-conductive transistor 21, is approximately equal to voltage $V_c$, as the base current of transistors 20 and 28 produce only a small voltage drop across resistor 24. Transistor 8, the base and collector of which have substantially the same potential, is not saturated and behaves substantially as a conducting diode. The voltage at the emitter is equal to the voltage at the base less the threshold voltage across the said diode. During the period of time in which voltage $V_c$ increases, the voltage at the base of the transistor 7, which is then in the conductive state, which base is connected to the collector of the non-conducting transistor 20, is approximately equal to voltage $V_c$, as the base currents of transistors 21 and 28 produce only a small voltage drop across resistor 23. The value of the voltage at the emitter of transistor 7, and consequently that of transistor 8, the last-mentioned transistor being non-conductive, differs therefore, little from the value of the same voltage in the conducting state of the transistor 8. As transistors 7 and 8 switch low voltages and as the transistors are of the npn-type, cutting them off is effected very rapidly on reaching a reference voltage. As is known, npn-transistors have better high-frequency properties than pnp-transistors.

The change of state of flip-flop 20, 21 from one to the other stable state is also effected very rapidly as also this flip-flop comprises npn-transistors which do not go into the saturated state. For this, the values of resistors 23 and 24 and the value of the current from source 22 are chosen such that the variation of the voltage across transistors 20 and 21 is lower than a diode threshold voltage. In a practical embodiment, a triangle generator having a free-running repetition rate of approximately 6 MHz was constructed, the flip-flop switching voltages from 0.3 to 0.4 V. Such a high frequency cannot be reached if point A is connected to the supply voltage in which case both the switch and the flip-flop must switch higher voltages. As in addition, the collector of the non-conductive transistor of the flip-flop carries in this case the potential of the supply voltage, the switch must comprise pnp-transistors. This is shown in FIG. 6 of the U.S. Pat. No. 3,745,367. With the present circuit, transistor 2 is indeed of the pnp-type but this is a transistor which does not operate as a switch.

The present circuit can be integrated in a semiconductor body. At high frequencies, capacitor C has a small capacitance, so that also this capacitor can be integrated in the semiconductor body. In that case resistor 5, which partly determines the frequency of the generated voltage, is the sole external component of the circuit. In the above-mentioned embodiment, the generator is used as a teletext data clock in a television receiver. The frequency of the generated signal is divided so as to obtain a line-frequency signal whose phase is compared to the phase of the received line synchronizing signal for generating a control signal. The square-wave voltage present at a collector of the flip-flop is used as an output signal of the generator. The control signal is superposed on one of the reference voltages of the comparison stage to extend or shorten, respectively, the period of the triangular wave form.

If a higher current gain is desired for the switch, darlington pairs may be substituted for single transistors. Because of the additional diode threshold voltages, the voltages at the collectors of transistors 20 and 21 must then be higher, so that the supply voltage of the flip-flop must also be higher than was the case in the foregoing. While voltage $V_c$ varies between 3 and 6 V, the voltage at point A must then vary between, for example, 3.5 and 6.5 V, for which the buffer stage comprising elements 25 to 32, inclusive, can be adapted in a simple way. In such a case the switching actions are also effected very rapidly and that for the same reasons as in the foregoing. It will moreover be obvious that it is of no real importance for the invention that the variation of the voltage at point A is approximately equal to the variation of voltage $V_c$. For a fast change-over, it is sufficient for the voltage at point A to be of the same order of magnitude as voltage $V_c$, that is to say with a small difference from the latter, and that it varies in the same direction, that is to say becomes higher when voltage $V_c$ becomes higher and lower when voltage $V_c$ becomes lower.

It will also be obvious that the buffer stage which separates capacitor C and point A from each other to prevent the capacitor from being loaded, may be of a different construction than that shown in the FIGURE. The only important element is the emitter-follower 28, whose base carries a voltage which is higher than the voltage $V_c$ by one or more times a diode threshold voltage. The other, known portions of the circuit may also be of a different construction. In the embodiment described, transistors 7, 8, 20 and 21 are preferably not transistors of the pnp-type. The description is based on npn transistors i.e. bipolar switching elements the mode of operation of which is predominantly based on electron conduction. It will be obvious that alternatively unipolar switching element, such as field effect transistors, are suitable for the purpose aimed at.

What is claimed is:

1. A circuit for generating a triangular voltage across a capacitor, comprising a charging current source for charging the capacitor, a discharging current source for thereafter discharging the capacitor, a comparison stage for comparing the generated voltage with a first and a second reference voltage, respectively, and for respectively generating a setting signal when the value of the first reference voltage is reached, and a resetting signal when the value of the second reference voltage is reached, and a bistable switching element having active elements which, in response to the setting or resetting signal, respectively, repeatedly changes its state to control a switch having active elements which determines charging or discharging, respectively, of the capacitor, characterized in that the circuit also comprises a buffer stage connected to the capacitor for deriving, under control of the capacitor voltage, a supply voltage for the bistable switching element which is of the same order of magnitude and varies in the same direction as the generated triangular voltage.

2. A circuit as claimed in claim 1, characterized in that the variation of the supply voltage for the bistable switching element is substantially equal to the variation of the generated triangular voltage.

3. A circuit as claimed in claim 2, characterized in that the supply voltage for the bistable switching element is substantially equal to the voltage across the capacitor.

4. A circuit as claimed in claim 2, characterized in that the buffer stage comprises a transistor operating as an emitter-follower and whose emitter is connected to the supply voltage terminal for the bistable switching element and whose base carries a voltage, the difference between which and the voltage across the capacitor is approximately equal to one or more times a diodes threshold voltage.

5. A circuit as claimed in claim 1, characterized in that the active elements of the switch comprise only semiconductor switching elements whose operation is predominantly based on electron conduction and which are operative out of the saturation range.

6. A circuit as claimed in claim 1, characterized in that the active elements of the bistable switching element comprise only semiconductor switching elements whose operation is predominantly based on electron conduction and which are operative out of the saturation range.

7. A circuit as claimed in claim 6, characterized in that the variation of the voltage across the semiconductor switching elements of the bistable switching element is lower than a diode threshold voltage.

8. A circuit as claimed in claim 3, characterized in that the buffer stage comprises a transistor operating as an emitter-follower and whose emitter is connected to the supply voltage terminal for the bistable switching element and whose base carries a voltage the difference between which and the voltage across the capacitor is approximately equal to one or more times a diodes threshold voltage.

* * * * *